United States Patent
Shen et al.

(10) Patent No.: US 11,401,626 B2
(45) Date of Patent: Aug. 2, 2022

(54) SEEDING METHOD FOR CRYSTAL GROWTH

(71) Applicant: Zing Semiconductor Corporation, Shanghai (CN)

(72) Inventors: Weimin Shen, Shanghai (CN); Youshu Lei, Shanghai (CN)

(73) Assignee: Zing Semiconductor Corporation, Shanghai (CN)

( * ) Notice: Subject to any disclaimer, the term of this patent is extended or adjusted under 35 U.S.C. 154(b) by 0 days.

(21) Appl. No.: 17/160,198

(22) Filed: Jan. 27, 2021

(65) Prior Publication Data

US 2022/0136132 A1 May 5, 2022

(30) Foreign Application Priority Data

Nov. 3, 2020 (CN) .......................... 202011211500.1

(51) Int. Cl.
*C30B 15/20* (2006.01)
*C30B 15/30* (2006.01)
*C30B 15/10* (2006.01)

(52) U.S. Cl.
CPC .............. *C30B 15/30* (2013.01); *C30B 15/10* (2013.01)

(58) Field of Classification Search
CPC .......... C30B 29/06; C30B 15/20; C30B 15/00
See application file for complete search history.

(56) References Cited

U.S. PATENT DOCUMENTS

2002/0129759 A1* 9/2002 Fujiwara ................. C30B 29/06
117/33
2002/0157600 A1* 10/2002 Fusegawa ............... C30B 29/06
117/30
2009/0038537 A1* 2/2009 Minami .................. C30B 29/06
117/13
2009/0114147 A1* 5/2009 Cho ........................ C30B 29/06
117/32
2020/0208293 A1 7/2020 Liu et al.

FOREIGN PATENT DOCUMENTS

CN 101580963 A 11/2009
CN 107653489 B 6/2020

OTHER PUBLICATIONS

Taiwanese Office Action, dated Dec. 2, 2021, in a counterpart Taiwanese patent application, No. TW 109146892.

* cited by examiner

*Primary Examiner* — Matthew J Song
(74) *Attorney, Agent, or Firm* — Chen Yoshimura LLP

(57) ABSTRACT

A seeding method for crystal growth comprising: a first seeding step: rotating a crucible with a first rotation speed to grow the crystal to a first length; a second seeding step: gradually increasing the rotation speed of the crucible from the first rotation speed to a second rotation speed, and growing the crystal to a second length; a third seeding step: rotating the crucible with the second rotation speed to growing the crystal to a predicted length. By separating the seeding stage to three steps and gradually increasing the rotation speed in the second step of the crucible, the silicon melt convection is enhanced and the temperature at center of the silicon melt is kept to be not lower than the starting temperature of the seeding. Thereby, the removal of dislocation within the seed crystal can be increased, and the growth problems such as broken or polycrystallization can be prevented.

7 Claims, 2 Drawing Sheets

SEEDING METHOD FOR CRYSTAL GROWTH

BACKGROUND OF THE INVENTION

1. Field of the Invention

The present application relates to the crystal growth, in particular to a seeding method for the crystal growth.

2. Description of the Related Art

With the rapid development of integrated circuit (IC), the single crystal silicon materials for IC grade are requested strictly by the device manufacturers. The large diameter single crystal silicon is the essential substrate material for the device manufacture. Czochralski method is the conventional and main method to grow single crystal from the melt. Generally, the raw material is fed into a quartz crucible and heated to melt, a seed crystal contacts to the melt surface, and the seed crystal is pulled. Under the controlled conditions, rearrangement of atoms or molecules continuously occurs at the interface between the seed crystal and the melt, and solidification occurs when the temperature decreases to form the crystal.

In the conventional seeding method, the constant rotation speeds of the crucible and the seed crystal are applied. While the suitable temperature of seeding is confirmed, the heater temperature or power is maintained to start the seeding. However, broken and polycrystallization of the ingot usually occur at the stage of body growth while the ingot is grown to a certain length, and re-melt treatment is therefore required. Such problem causes the wastes of time and electric energy. The broken and polycrystallization of the ingot involve with non-removal of dislocation within the seed crystal. The solutions includes length elongation of the seed crystal, increase of times of dislocation removal at diameter change stage, increase of temperature or power of the heater at initial seeding stage, pulling and forming the seed crystal with suitable diameter. However, even the seed crystal has a large length, the broken of the seed crystal cannot be improved significantly. In addition, the large length of the seed crystal restricts the total length of the ingot. The small diameter of the seed crystal increases the risk of broken of the seed crystal. It easily causes the seed crystal with the small diameter or be melt to broke if the temperature or power of the heater is increased at initial seeding stage.

Accordingly, a novel seeding method for crystal growth is needed to solve the above problems.

SUMMARY

In the summary of the invention, a series of concepts in a simplified form is introduced, which will be described in further detail in the detailed description. This summary of the present invention does not intend to limit the key elements or the essential technical features of the claimed technical solutions, nor intend to limit the scope of the claimed technical solution.

This invention provides a seeding method for crystal growth comprises: a first seeding step: rotating a crucible with a first rotation speed to grow the crystal to a first length; a second seeding step: gradually increasing the rotation speed of the crucible from the first rotation speed to a second rotation speed, and growing the crystal to a second length while the rotation speed reaches the second rotation speed; a third seeding step: rotating the crucible with the second rotation speed to growing the crystal to a predicted length.

Further, a ratio of the first length to the predicted length is 0.3-0.6.

Further, a ratio of the second length to the predicted length is 0.5-0.9.

Further, a ratio of the second rotation speed to the first rotation speed is 1.2-2.5.

Further, the rotation speed of the crucible gradually increases from the first rotation speed to a second rotation speed step by step.

Further, in the second seeding step, the rotation speed of the crucible is increased to a predict speed while the crystal grows to a desired length.

Further, the first length is 80 mm-120 mm, the second length is 180 mm-220 mm, and the predicted length is 280 mm-320 mm Further, the first rotation speed is 0.25 rpm-0.50 rpm and the second rotation speed is 0.35 rpm-1.0 rpm.

Further, the seed crystal has a rotation speed of 8 rpm-12 rpm and a predicted diameter of the seed crystal is 4 mm-6 mm.

In this invention, by separating the seeding stage to three steps and gradually increasing the rotation speed in the second step of the crucible, the silicon melt convection is enhanced and the temperature at center of the silicon melt is kept to be not lower than the starting temperature of the seeding. Thereby, the removal of dislocation within the seed crystal can be increased, and the growth problems such as broken or polycrystallization can be prevented.

DETAILED DESCRIPTION OF THE EMBODIMENTS

Figure 1:
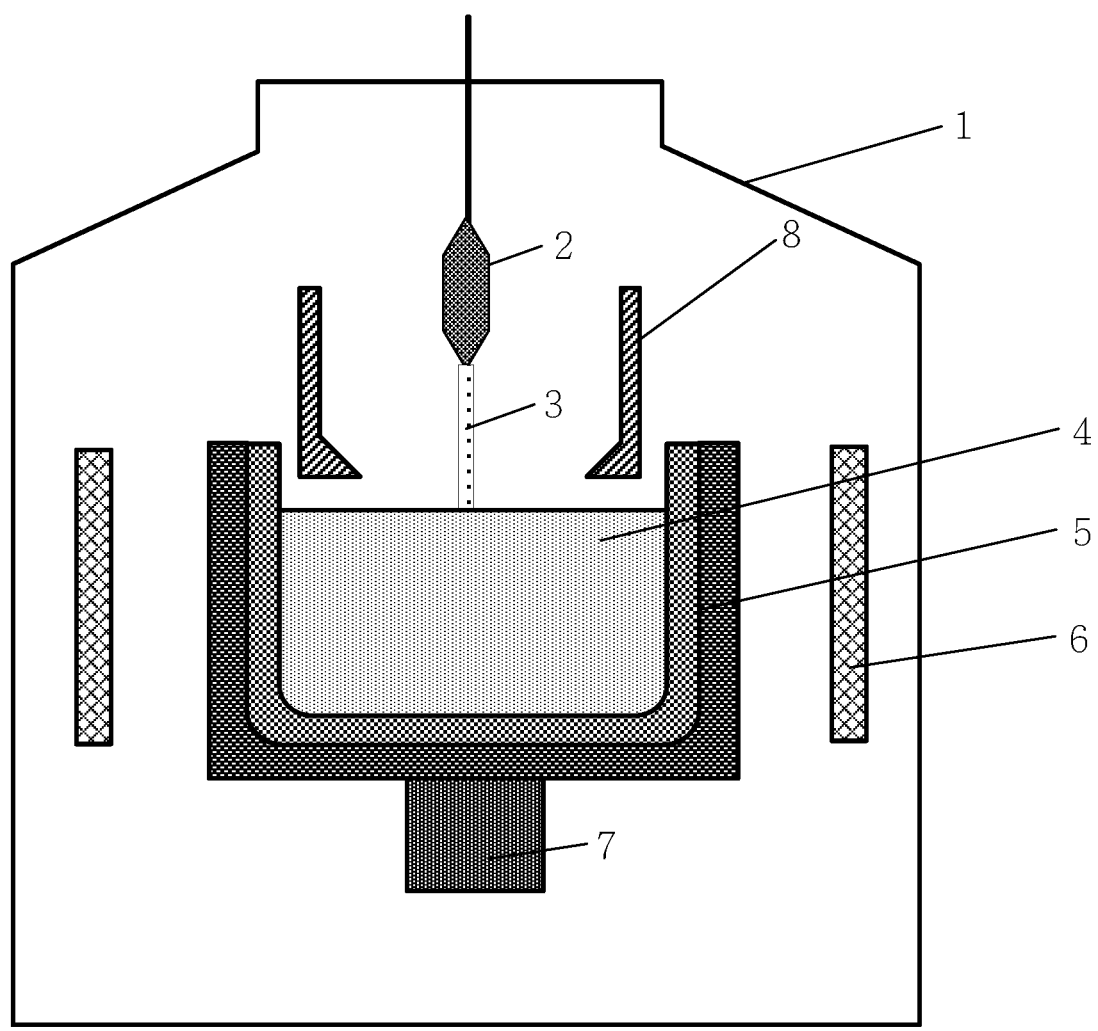
FIG. 1 shows a diagram of a device for crystal growth in accordance with one embodiment of the present application.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

For a thorough understanding of the present invention, the detailed steps will be set forth in detail in the following description in order to explain the technical solution of the present invention. The preferred embodiments of the present invention is described in detail as follows, however, in addition to the detailed description, the present invention also may have other embodiments.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

It should be understood that the present invention may be practiced in different forms and that neither should be construed to limit the scope of the disclosed examples. On the contrary, the examples are provided to achieve a full and complete disclosure and make those skilled in the art fully receive the scope of the present invention. In the drawings, for clarity purpose, the size and the relative size of layers and areas may be exaggerated. In the drawings, same reference number indicates same element.

In the conventional seeding method, while the seed crystal reaches a certain length, e.g. 100 mm, it starts to increase the diameter of the seed crystal. Accordingly, the dislocation within the seed crystal cannot be removed. To increase the diameter of the seed crystal, the temperature of the seed crystal and its interface part is cooled. In particular, the temperature of the seed chuck (graphite) decreases rapidly because of the lifting of the chuck position. The temperature of the melt surface below of the chuck decreases because of heat escape caused by thermal radiation.

In the present application, it considers to increase the rotation speed of the crucible and the convection strength to compensate the escaped heat at the seed crystal and its interface part. Accordingly, the temperature at center of the silicon melt is maintained stably to ensure the stability of the diameter and the removal of dislocation.

The device of crystal growth is shown in FIG. 1. The device comprises a furnace body 1, a crucible 5 located within the furnace body 1, a heater 6 surrounding the crucible 5, a silicon melt 4 carried by the crucible 5, a seed crystal 3 disposed via a seed chuck 2 above the silicon melt 4. In one embodiment, the seed crystal 3 is for growing the monocrystalline silicon ingot.

In one embodiment, the furnace body 1 is a stainless steel chamber full of a protective gas or being vacuum. In one embodiment, the protective gas is argon with a purity of 97% or more, a pressure of 5 mbar-100 mbar, and a flow of 70 slpm-200 slpm.

In one embodiment, the crucible 5 is made of the thermal resistant and corrosion resistant material, and carries the silicon melt 4 for crystal growth. In one embodiment, the crucible 5 includes a quartz crucible and/or a graphite crucible, wherein the quartz crucible is put into the graphite crucible. The crucible 5 contains the silicon material such as polycrystalline silicon. The silicon material in the crucible 5 is heated to form the silicon melt 4 for growing the ingot. The seed crystal is immersed into the silicon melt. Then, the seed crystal is rotated and slowly pulled by the seed shaft to grow the silicon atoms along with the seed crystal to form an ingot. The seed crystal is obtained by cutting or drilling the monocrystalline silicon with a certain crystal orientation, for example, <100>, <111>, <110> and the like. The seed crystal is generally a cylinder.

In one embodiment, the heater 6 surrounds the crucible 5. The heater 6 is a graphite heater, which can be disposed on the side and/or the bottom of the crucible 5, to heat the crucible 5. Further, the heater 6 includes one or plural heaters surrounding the crucible 5, to make the uniform distribution of the thermal field of the crucible 5.

In one embodiment, the device further comprises a reflection shield 8 within the furnace body 1. The reflection shield 8 locates above the crucible 5 and surrounds the ingot. The reflection shield 8 prevents from thermal loss caused by the thermal radiation from the silicon melt 4 to the furnace body 1.

Further, the device further comprises a crucible lifting unit 7 for supporting and rotating the crucible shaft, to make the crucible 5 lift and rotate.

In one embodiment, the procedure of growth of monocrystalline silicon ingot includes, in sequence, seeding, shouldering, crowning, body growing and tailing.

Firstly, the seeding stage is conducted. While the temperature of the silicon melt 4 is stable at a certain temperature, the seed crystal 3 is immersed into the silicon melt 4. Then, the seed crystal 3 is pulled with a certain speed to grow the silicon atoms along with the seed crystal to form a neck until the neck has a predicted length. The seeding stage is to eliminate the dislocation defects formed in the single crystal caused by thermal shock. Supercooling of the crystal edge drives silicon atoms to arrange sequentially on the silicon solid at the solid-liquid interface, and the single crystal is formed. In one embodiment, the pulling rate is 1.5 mm/min-4.0 mm/min, the neck length is 0.6-1.4 folds of the ingot diameter, and the neck diameter is 5 mm-7 mm.

The shouldering stage is then conducted. While the neck has a predicted length, the pulling rate to the seed crystal 3 is decreased and the temperature of the silicon melt 4 is slightly reduced. The temperature reduction is to promote the horizontal growth of the ingot, namely, the cooling step is to increase the ingot diameter.

The crowning stage is then conducted. While the ingot diameter increases to reach the predicted diameter, the heating power of the heater 6 is increased to increase the temperature of the silicon melt 4. At the same time, the lifting rate and the rotation speed of the seed crystal 3 and the rotation speed of the crucible 5 are also adjusted to inhibit the horizontal growth but facilitate the vertical growth of the ingot. Accordingly, the single crystal silicon is almost grown with isometric diameter.

Then the body growing stage is conducted. While the ingot diameter reaches the predicted diameter, the process enters the body growing stage. The cylinder ingot formed in this stage is the isometric section of the ingot. In particular, the crucible temperature, the crystal pulling rate, the crucible rotation speed and the crystal rotation speed are adjusted to stabilize the growth rate and maintain the ingot diameter until completion of the crystal pulling. The body growing stage is the main stage of single crystal growth and may spend dozens hours or over one hundred hours.

The tailing stage is the final stage. At this stage, the lifting rate and the temperature of the silicon melt 4 are increased to reduce the ingot diameter to form a cone. While the cone tip is small enough, the ingot leaves from the liquid surface. The ingot is lifted to the upper furnace and cooled for a while. One growth cycle is completed accordingly.

Regarding the growth of the monocrystalline silicon, the seeding procedure is an important stage. To analyze the situations of the seeding procedure, the reasons of formation of the broken and polycrystallization of the ingot, include, but not be limited to, the following reasons. The diameter of the seed crystal increases in the latter part of the seeding procedure. The pulling rate of the seeding procedure increases in the latter part of the seeding procedure. The increases of the diameter and the pulling rate involve with the gradual temperature decrease at the center of the liquid surface. The rapid decrease of the temperature relates to the decrease at the liquid surface center, the lifting of the position of the seed chuck, and the thermal radiation within the draft tube or the water-cooled jacket. The thermal radiation also rapidly reduces the surface temperature of the silicon melt below the seed chuck. The lifting of the seed chuck alters the argon flow below the chuck, causing the cooling of the silicon melt surface below the seed chuck. In the latter part of the seeding procedure, the actual temperature is lower than the suitable seeding temperature because of the cooling at the center of liquid surface, so that the dislocation within the seed crystal cannot be eliminated sufficiently. Regarding the cooling at the center of liquid surface, it involves with thermal escape from the center of liquid surface, and lack of thermal supplement to the melt convection. The conventional solution is to enhance the silicon melt convection by adjusting the temperature and power of the heater. However, the thermal transmittance of the heater has a considerably time lag, so that the improved effect is very limited.

Figure 2:
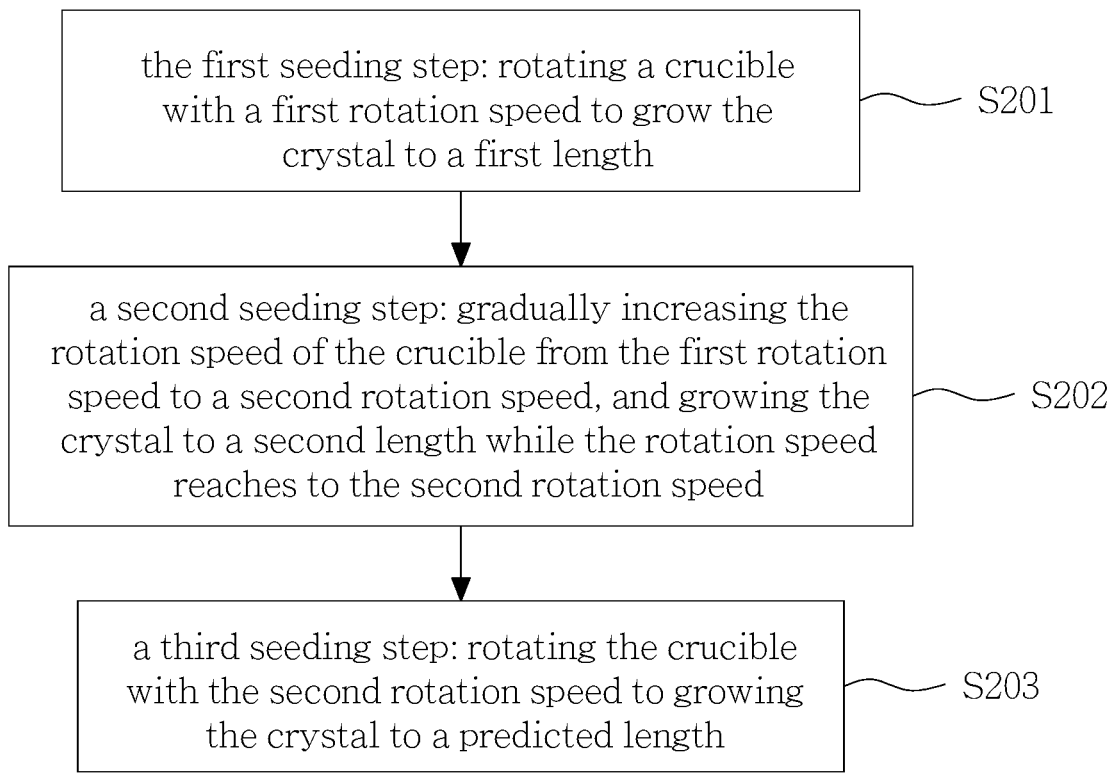
FIG. 2 shows a flow chart for the seeding method of crystal growth in accordance with one embodiment of the present application.

Regarding the conventional technical problems such as broken or polycrystallization during the seeding stage, this invention, based on the above analysis, provides a seeding method for crystal growth as shown in FIG. 2. The method comprises:

Step S201: the first seeding step: rotating a crucible with a first rotation speed to grow the crystal to a first length;

Step S202: a second seeding step: gradually increasing the rotation speed of the crucible from the first rotation speed to a second rotation speed, and growing the crystal to a second length while the rotation speed reaches to the second rotation speed; and Step S203: a third seeding step: rotating the crucible with the second rotation speed to growing the crystal to a predicted length.

In one embodiment, regarding the horizontal magnetic field applied Czochralski (HMCZ), the seeding conditions include but not be limited to the strength of magnetic field, the rotation speeds of the crucible and the seed crystal, the predicted length and the predicted diameter of the seed crystal.

Further, the rotation speeds of the seed crystal is a constant speed.

In one embodiment, the HMCZ includes the horizontal magnetic field of 1500 G-2500 G, preferably 2000 G. The rotation speeds of the seed crystal is 8 rpm-12 rpm, preferably 10 rpm. The predicted diameter of the seed crystal is 4 mm-6 mm, preferably 5 mm. The predicted length is 280 mm-320 mm, preferably 300 mm.

Firstly, Step S201: the first seeding step is conducted. The crucible rotates with a first rotation speed to grow the crystal to a first length In one embodiment, the ratio of the first length to the predicted length is 0.3-0.6. Further, the first length is 80 mm-120 mm.

In one embodiment, the first rotation speed is 0.25 rpm-0.50 rpm, preferably 0.3 rpm.

In one embodiment, to grow a single crystal silicon having a predicted length of 300 mm under the strength of the horizontal magnetic field of 3500 G, the first rotation speed of the crucible is 0.3 rpm, the rotation speed of the seed crystal is 10 rpm, and the predicted diameter of the seed crystal is 5 mm. The first rotation speed of the crucible and the rotation speed of the seed crystal are maintained until the crystal grows to 100 mm.

Step S202: a second seeding step is then conducted. The rotation speed of the crucible gradually increases from the first rotation speed to the second rotation speed. While the rotation speed reaches to the second rotation speed, the crystal grows to a second length.

In one embodiment, the ratio of the second length to the predicted length is 0.5-0.9. Further, the second length is 180 mm-220 mm.

In one embodiment, the ratio of the second rotation speed to the first rotation speed is 1.2-2.5.

In one embodiment, the rotation speed of the crucible gradually increases from the first rotation speed to a second rotation speed step by step.

In one embodiment, in the second seeding step, the rotation speed of the crucible increases with a predict speed while the crystal grows to a desired length. Further, the desired length is 4 mm-6 mm, preferably 5 mm, and the predict speed is 0.005 rpm-0.015 rpm, preferably 0.01 rpm.

In one embodiment, the second rotation speed is 0.35 rpm-1.0 rpm, preferably 0.5 rpm.

In one embodiment, starting from the ingot length of 100 mm, whenever the ingot length increase 5 mm, the rotation speed of the crucible increases 0.01 rpm. Such increase is conducted until the ingot length of 200 mm.

By gradually increasing the rotation speed of the crucible in the second step, the silicon melt convection is enhanced and the temperature at center of the silicon melt is kept to be not lower than the starting temperature of the seeding. Thereby, the removal of dislocation within the seed crystal can be increased, and the growth problems such as broken or polycrystallization can be prevented.

It should be explained that the gradual increase of the rotation speed of the crucible may be achieved by other suitable means, such as continuous linear increasing, non-continuous linear increasing and the like.

Step S203: a third seeding step is then conducted. The crucible rotates with the second rotation speed until the crystal grows to the predicted length.

In one embodiment, starting from the ingot length of 200 mm, the second rotation speed of the crucible is 0.5 rpm. The second rotation speed of the crucible and the rotation speed of the seed crystal are maintained until the crystal grows to 300 mm. The crystal formed according to this embodiment has an average diameter of 5 mm-6 mm in the latter part of the seeding procedure, an isometric length of 200 mm-400 mm after the shouldering and crowning procedures. The problem such as broken and polycrystallization of the formed crystal is rare, and the frequency of the problem occurrence is lower than 20%. However, under the same conditions but the rotation speed of the crucible is maintained as about 0.5 rpm in the entire procedure, the frequency of the problem occurrence is about 70%.

In the present application, by separating the seeding stage to three steps and gradually increasing the rotation speed of the crucible in the second step, the silicon melt convection is enhanced and the temperature at center of the silicon melt is kept to be not lower than the starting temperature of the seeding. Thereby, the removal of dislocation within the seed crystal can be increased, and the growth problems such as broken or polycrystallization can be prevented.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure. The scope of the present invention is defined by the appended claims and their equivalent scope.

What is claimed is:

1. A method for a semiconductor silicon crystal growth by using Czochralski method comprising the following steps in sequence: seeding, shouldering, crowning, body growing and tailing, and
in the seeding step, a seed crystal being contacted to a surface of a silicon melt in a crucible, and the seed crystal is pulled under a rotation of the crucible;
the method is characterized by that:
the rotation of the crucible comprises:
a first seeding step: rotating the crucible with a first rotation speed to grow the crystal to a first length, wherein the first rotation speed is 0.25 rpm-0.50 rpm;
a second seeding step: increasing the rotation speed of the crucible from the first rotation speed to a second rotation speed with an increasing rate of 0.01 rpm per 5 mm of increase of the length of the crystal, and growing the crystal to a second length; and
a third seeding step: rotating the crucible with the second rotation speed to growing the crystal to a third length.

2. The method of claim 1, wherein a ratio of the first length to the third length is 0.3-0.6.

3. The method of claim 1, wherein a ratio of the second length to the third length is 0.5-0.9.

4. The method of claim 1, wherein a ratio of the second rotation speed to the first rotation speed is 1.2-2.5.

5. The method of claim 1, wherein the first length is 80 mm-120 mm, the second length is 180 mm-220 mm, and the third length is 280 mm-320 mm.

6. The method of claim 1, wherein the second rotation speed is 0.35 rpm-1.0 rpm.

7. The method of claim 1, wherein the seed crystal has a rotation speed of 8 rpm-12 rpm and a diameter of 4 mm-6 mm.

* * * * *